(12) United States Patent
Tokitoh et al.

(10) Patent No.: US 7,675,175 B2
(45) Date of Patent: Mar. 9, 2010

(54) SEMICONDUCTOR DEVICE HAVING ISOLATED POCKETS OF INSULATION IN CONDUCTIVE SEAL RING

(75) Inventors: Shunichi Tokitoh, Tokyo (JP); Seiichi Kondou, Ibaraki (JP); Bo Un Yoon, Seoul (KR)

(73) Assignee: Oki Semiconductor Co., Ltd., Tokyo (JP)

( * ) Notice: Subject to any disclaimer, the term of this patent is extended or adjusted under 35 U.S.C. 154(b) by 140 days.

(21) Appl. No.: 11/150,107

(22) Filed: Jun. 13, 2005

(65) Prior Publication Data

US 2006/0001165 A1    Jan. 5, 2006

(30) Foreign Application Priority Data

Jun. 15, 2004   (JP)   ............................ 2004-177259

(51) Int. Cl.
   *H01L 23/48*   (2006.01)
(52) U.S. Cl. ........................ 257/758; 257/760; 257/773; 257/774; 257/620; 257/730; 257/E23.001; 257/E23.002; 257/E23.116; 257/E23.194
(58) Field of Classification Search ................ 438/758; 257/758, 760, 773, 774, 127, 170, 409, FOR. 230, 257/E23.002, 620, 730, E23.001, E23.116, 257/E23.194

See application file for complete search history.

(56) References Cited

U.S. PATENT DOCUMENTS

| | | | |
|---|---|---|---|
| 4,954,142 A | 9/1990 | Carr et al. | |
| 6,670,710 B2 | 12/2003 | Matsunaga | |
| 7,119,439 B2 | 10/2006 | Watanabe et al. | |
| 7,315,072 B2 | 1/2008 | Watanabe | |
| 2004/0195582 A1* | 10/2004 | Tomita et al. | ............... 257/127 |
| 2005/0087878 A1* | 4/2005 | Uesugi et al. | ............... 257/758 |

FOREIGN PATENT DOCUMENTS

| | | |
|---|---|---|
| JP | 6193681 | 12/1994 |
| JP | 98039 | 1/1997 |
| JP | 200153148 | 2/2001 |
| JP | 2001267318 | 9/2001 |
| JP | 2002353307 | 12/2002 |
| JP | 200386589 | 3/2003 |
| JP | 200464046 | 2/2004 |

* cited by examiner

*Primary Examiner*—Kenneth A Parker
*Assistant Examiner*—Jay C Kim
(74) *Attorney, Agent, or Firm*—Volentine & Whitt, P.L.L.C.

(57) ABSTRACT

A semiconductor device with a damascene wiring structure which can prevent short-circuits between a seal ring and a wiring line or electrode pad. An upper layer barrier layer made from a conductive barrier material film is formed on an interlayer insulating film groove sidewall of the semiconductor device. Embedded in the groove is an upper layer seal ring wiring line with thickness of approximately 10 micrometers for instance, in which a plurality of isolated pockets of insulators are dispursed. These isolated pockets of insulators are formed using the interlayer insulating film which forms the damascene wiring line. Additionally, a first upper layer groove wiring line and a second upper layer groove wiring line are formed in an element forming region, and an upper layer barrier layer is formed on the outside perimeter. The upper layer seal ring wiring line and both upper layer wiring lines all have damascene wiring structures.

3 Claims, 9 Drawing Sheets

SEMICONDUCTOR DEVICE HAVING ISOLATED POCKETS OF INSULATION IN CONDUCTIVE SEAL RING

BACKGROUND OF THE INVENTION

1. Field of the Invention

The present invention relates to a semiconductor device, and in particular relates to a semiconductor device which has a damascene wiring structure.

2. Description of the Related Art

Miniaturizing of the elements which form semiconductor devices is most effective for increasing the performance of the semiconductor device, and currently, the design standards for this dimension are shifting from 65 nm to 45 nm, and technology development is vigorously being promoted. Furthermore, in order to increase the performance of semiconductor devices having miniaturized structures, a groove wiring line formed by the so-called damascene method, or in other words, a damascene wiring line is necessary, wherein a wiring material layer such as a copper (Cu) layer is deposited onto an interlayer insulating layer which has grooves formed by minute machining and the wiring material layer region that is not embedded in the grooves is removed by chemical mechanical polishing (CMP) in order to reduce resistance of the wiring which connects between the elements and to minimize parasitic capacitance of the wiring. For example, refer to Japanese Patent Kokai No. H2-278822 (patent document 1).

In order to form this damascene wiring, a low inductance insulating film material which has lower relative induction than a silicon oxide film must be used as the interlayer insulating film in place of silicon oxide. Furthermore, the low inductance film will need to be made porous in order to further reduce the inductance of the interlayer insulating film. A low inductance film refers to a insulating film where the relative inductance of the silicon dioxide layer is 3.9 or less.

However, a low inductance film generally has low film density, so moisture absorbency or moisture permeability is high, and therefore, penetration of moisture into the low inductance film must be prevented. This is because penetration of even a minute amount of moisture will cause an increase in the relative inductance of the low inductance film and a drop in the reliability of the damascene wiring. Therefore, a barrier wall (seal ring) formed from the material which forms the wiring layer is generally provided along the outside edge of the semiconductor chip. For example, refer to Japanese Patent Kokai No. 2002-353307 (patent document 2).

A conventional seal ring will be described below while referring to FIG. 1 through FIG. 4C. FIG. 1 is a top view drawing of a semiconductor chip which is two dimensionally arranged on a semiconductor wafer, FIG. 2 is a partial enlarged drawing of the outside edge of the semiconductor chip, FIG. 3 is a cross-section drawing of the seal ring, and FIG. 4A through FIG. 4C are cross-section drawings of the seal ring element by manufacturing process.

As shown in FIG. 1, a seal ring 102 is formed on the outside edge of a semiconductor chip 101, or more particularly, along the dicing line so as to enclose the element forming region. The partially enlarged region 103 is shown in FIG. 2. The seal ring 102 is formed by overlaying and connecting multiple layers of conductor material which form the wiring and via plugs of the element forming region. FIG. 2 shows the top layer wiring made from damascene wiring. The seal ring 102 has a top layer barrier layer 104 made from a conductive barrier material film which is formed on the groove side wall of the interlayer insulating film of the semiconductor device and a top seal ring wiring 105 made from a wiring material film such as copper which is embedded in the groove, and the element forming region has a first top layer groove wiring line 106 and a second top layer groove wiring line 107, and a top layer barrier layer 104 is established around the perimeter. The top layer seal ring wiring 105 and both top layer wiring lines have a "dual" damascene wiring structure.

The cross-section structure of the seal ring 102 region is shown in FIG. 3. FIG. 3 is a cross section drawing viewed in the direction of arrow X1-X1 in FIG. 2. As shown in FIG. 3, a bottom insulating film 109 is formed from silicon oxide on a silicon substrate 108, and a contact hole for seal ring 110 which extends to the surface of the silicon substrate 108 is formed in a designated region of the bottom insulating film 109 of the semiconductor chip outside edge. The contact hole for seal ring 110 is formed such that the outside edge of the semiconductor chip 101 forms a square as shown in FIG. 1. Furthermore, the contact hole 110 is filled by a seal ring contact plug 111 made from a conductor such as tungsten (W). Similarly, a contact hole 112 is formed which extends to a gate electrode (not shown in the drawings) and a dispersion layer formed on the surface of the silicon substrate 108 in the element forming region, and the contact hole 112 is filled with a contact plug 113 made from a conductor such as tungsten.

Furthermore, in order to form bottom damascene wiring for the semiconductor device, a first etching stopper layer 114a, a first low inductance film 114b, and a first cap layer 114c are overlaid, this multilayer film forms a first interlayer insulating film 114, lower layer barrier layer 115 and lower layer seal ring wiring 116 are formed in the groove for the seal ring which is formed in a designated region, and contact a seal ring contact plug 111. The lower layer seal ring wiring 116 has a damascene wiring structure, and the line width is approximately 10 micrometers. Similarly, a lower layer barrier layer 115, a first lower layer groove wiring line 117, and a second lower layer groove wiring line 118 are formed in the groove for wiring established in the designated region of the first interlayer insulating film 114, and are electrically connected to the corresponding contact plug 113. The line width of both lower layer groove wiring lines are approximately 0.1 micrometers. Furthermore, the first low inductance film 114b is made from a porous methyl silsesquioxane (p-MSQ) layer with a relative inductance of approximately 2.0, and the first etching stopper layer 114a and the first cap layer 114c are insulating layers with a relative inductance rate of approximately 3, such as carbon containing silicon oxide film (SiOC film) or silicon carbide (SiC) film.

Next, a second etching stopper layer 119a, a second low inductance film 119b, and a second cap layer 119c are overlaid to form a second interlayer insulating film 119, and a third etching stopper layer 120a, a third low inductance film 120b, and a third cap layer 120c are overlaid to form a third interlayer insulating film 120. Furthermore, a groove for the seal ring is formed in the second interlayer insulating film 119 and the third interlayer insulating film 120 and a top seal ring wiring 105 which will become the dual damascene wiring structure is connected to the lower layer seal ring wiring 116, together with an upper layer barrier layer 104. Similarly, a first upper layer groove wiring 106 with a dual damascene wiring structure is formed together with an upper layer barrier layer 104 in the second interlayer insulating layer 119 and the third interlayer insulating layer 120, and the second upper layer groove wiring 107 with a damascene wiring structure is formed together with the upper layer barrier layer 104 in the third interlayer insulating layer 120. The second low inductance film 119b and the third low inductance film 120b are p-MSQ films with a relative inductance rate of approximately 2.0, and the second etching stopper layer 119a, the third etching stopper layer 120a, the second cap layer 119c and the third cap layer 120c are insulating films with a relative inductance rate of approximately 3, such as SiC films or SiOC films.

Furthermore, a fourth etching stopper layer 121 made from SiC film or SiOC film and a passivation film 122 made from a silicon oxynitride (SiON) film are formed to cover the whole surface.

With the present invention, the seal ring contact plug 111, the lower layer seal ring wiring 116, and the upper layer seal ring wiring 105 form the seal ring 102. The seal ring 102 is not restricted to only 2 layer structures consisting of a lower layer seal ring wiring and an upper layer seal ring wiring as described above, and may be similarly formed with a multilayer structure of two or more mutually connected layers.

However, when seal rings 102 are formed with a (dual) damascene wiring structure as in the aforementioned conventional example, as can be seen in FIG. 2, a bridge region 123 will form at a certain frequency in a part of the semiconductor chip 101 region between the seal ring 102 and the groove wiring in the element forming region or the electrode pad (not shown in the drawings) of the groove structure. This problem will be described below using FIG. 4A through FIG. 4C. FIG. 4A-C are cross-section drawings as viewed in the direction of arrow $X_2$-$X_2$ in FIG. 2. Components in FIG. 4A-C which are identical to those in FIG. 3 are assigned the same reference numerals.

As shown in FIG. 4A, a silicon oxide film is overlaid onto a silicon substrate 108 of a semiconductor wafer using a commonly known chemical vapor deposition (CVD) method, the surface is flattened using a CMP method, and a bottom insulating film 109 is formed. Contact hole 110 and contact hole 112 for the seal ring are formed in a designated region using commonly known photolithography technology and dry etching technology, and these contact holes are filled with titanium (Ti), titanium nitride (TiN), or tungsten or the like, to form seal ring contact plug 111 and contact plug 113.

Next, the first interlayer insulating film 114, comprising a first etching stopper layer 114a, a first low inductance layer 114b, and a first cap layer 114c, is formed using the CVD method or a spin coating method. Furthermore, the first cap layer 114c, the first low inductance layer 114b, and the first etching stopper layer 114a are etched in order using commonly known photolithography technology and dry etching technology to form lower layer seal ring groove 124 with a pattern width of approximately 10 micrometers, and a first lower layer wiring groove 125 and a second lower layer wiring groove 126 are formed with a pattern width of approximately 0.1 micrometers. Furthermore, a barrier material film 127 such as tantalum nitride (TaN) is formed over the whole surface using a sputtering (PVD) method, and then a wiring material film 128 such as a copper film is formed using a plating method or the like.

Next, as shown in FIG. 4B, the wiring material film 128 and the barrier material film 127 are successively subjected to CMP in order to remove the unneeded regions of the wiring material film 128 and the barrier material film 127 on the first cap layer 114c and to form the lower layer wiring with a damascene wiring structure. However, the width of the seal ring groove 124 is relatively large at approximately 10 micrometers as will be described later, so during the CMP process, a wiring depression 129 known as dishing will occur on the surface of the lower layer seal ring wiring line 116. Furthermore, when this dishing occurs, a localized high polishing pressure will be applied from the CMP polishing pad to the surface of the first interlayer insulating film 114 in the region around the lower layer seal ring wiring 116 during the CMP process, and erosion will occur in this region such that an insulating film depression 130 will be formed.

Furthermore, as shown in FIG. 4C, the second interlayer insulating film 119 comprising the second etching stopper layer 119a, the second low inductance film 119b, and the second cap layer 119c, will form on the first interlayer insulating film 114 where partial erosion has occurred, and on the lower layer seal ring wiring 116 where the aforementioned dishing has occurred, and then the third interlayer insulating film 120 comprising a third etching stopper layer 120a, a third low inductance film 120b, and a third cap layer 120c will form on the aforementioned second interlayer insulating film 119. Furthermore, using commonly known photolithography technology and dry etching technology, an upper layer seal ring groove 131 with a dual damascene structure and a first upper layer wiring groove 132 are formed on the second interlayer insulating film 119 and the third interlayer insulating film 120, and the second upper layer wiring groove 133 are formed on the third interlayer wiring film 120. Therefore, in the region above the insulating film depression 130 which occurred in a portion of the first interlayer insulating film 114 because of the aforementioned erosion, the surface position of the third interlayer insulating film 120 will be recessed below the surface position of the other regions of the third interlayer insulating film 120 where erosion did not occur.

Furthermore, when forming the conductive layer material film and the wiring material film, and when performing CMP in order to form the upper layer wiring with damascene wiring structure, the barrier material film and the wiring material film above the aforementioned insulating film depression 130 cannot be removed by CMP and will remain, and therefore a bridge region 123 will form as described in FIG. 2.

SUMMARY OF THE INVENTION

When a low inductance film is used for the interlayer insulating film of a semiconductor device, the aforementioned seal ring must be formed and the width of this seal ring will be approximately 10 micrometers, extremely large compared to the minute elemental dimensions of 65 nm to 45 nm for semiconductor devices. This is necessary in order to prevent cracks which easily occur in the low inductance film during the dicing process of the semiconductor chip and during the CMP process for forming the damascene wiring structure. Note, when these cracks occur, there will be problems with moisture penetrating into the low inductance film as previously described. These cracks easily occur when the inductance is reduced in low inductance films. This is because the mechanical strain of the interlayer insulating film is inevitably reduced when reducing the inductance. Furthermore, these cracks easily occur when the semiconductor chip area is increased and when multiple layers of damascene wiring structures are used. Therefore, miniaturizing of this seal ring width has not progressed along with miniaturizing of the element structure of the semiconductor device.

Therefore, when a seal ring 102 is formed as described above wherein at least one part has a damascene wiring structure, a bridge region 123 will form at a certain frequency between the electrode pad and the groove wiring which is adjacent to the seal ring 102. When this type of bridge region occurs, the groove wiring or electrode pad of the element forming region will be electrically shorted to the seal ring 102 and the groove wiring or the electrode pad of the semiconductor device will cease to function. Furthermore, in the manufacturing process of the semiconductor device, fewer proper semiconductor chips will be produced and the yield of the semiconductor devices will be reduced. Furthermore, the occurrence of these bridge regions will become more dramatic as the number of layers of damascene wiring increases, With the foregoing in view, an object of the present invention is to essentially prevent these bridge regions from occurring in the seal ring of semiconductor devices.

In order to resolve these problems, the semiconductor device of the present invention relates to a semiconductor device which has semiconductor elements, wiring layers, and a plurality of interlayer insulating film layers on a semiconductor substrate, and provides a seal ring which encloses the semiconductor element region and is formed with a damascene wiring structure from conductive materials which formed the wiring layer, and isolated pockets of insulating material are arranged in designated regions of the seal ring made from this conductive material.

With the aforementioned invention, the isolated pockets of insulating material are preferably unevenly distributed in the seal ring toward the semiconductor element forming region side. Furthermore, the isolated pockets of insulating material are formed from the insulating film material that makes up the interlayer insulating film layer.

With the present invention, the seal ring is formed with a multilayer structure consisting of an upper layer damascene wiring structure and a lower layer damascene wiring structure which are mutually connected, and isolated pockets of insulating material are arranged in designated regions of the upper layer damascene wiring structure and isolated pockets of insulating material are arranged in designated regions of the lower layer damascene wiring structure. Alternately, the seal ring may be formed with a multilayer structure consisting of an upper layer damascene wiring structure and a lower layer damascene wiring structure which are mutually connected and formed without arranging isolated pockets of insulating material in designated regions of the upper layer damascene wiring structure and isolated pockets of insulating material in designated regions of the lower layer damascene wiring structure.

Furthermore, the flat pattern of the isolated pockets of insulating material is preferably rectangular. Alternately the flat pattern dimension of the isolated pockets of insulating material may be 0.5 micrometers or greater.

With the structure of the present invention, electrical shorts between the seal ring which contains a damascene wiring structure and the groove wiring which is adjacent to the seal ring or the electrode pad can be prevented, thus increasing the yield of the aforementioned semiconductor devices.

DETAILED DESCRIPTION OF THE INVENTION

Figure 1:
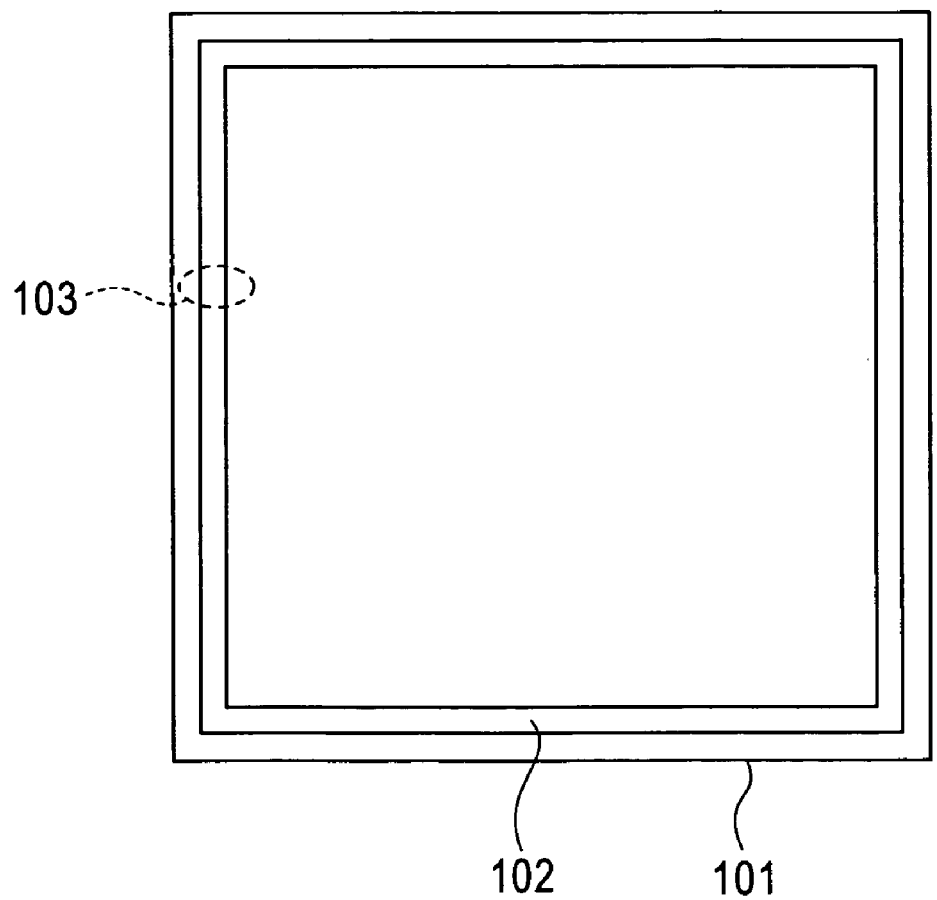
FIG. 1 is a top view drawing of a semiconductor chip showing a seal ring using conventional technology.
Figure 2:
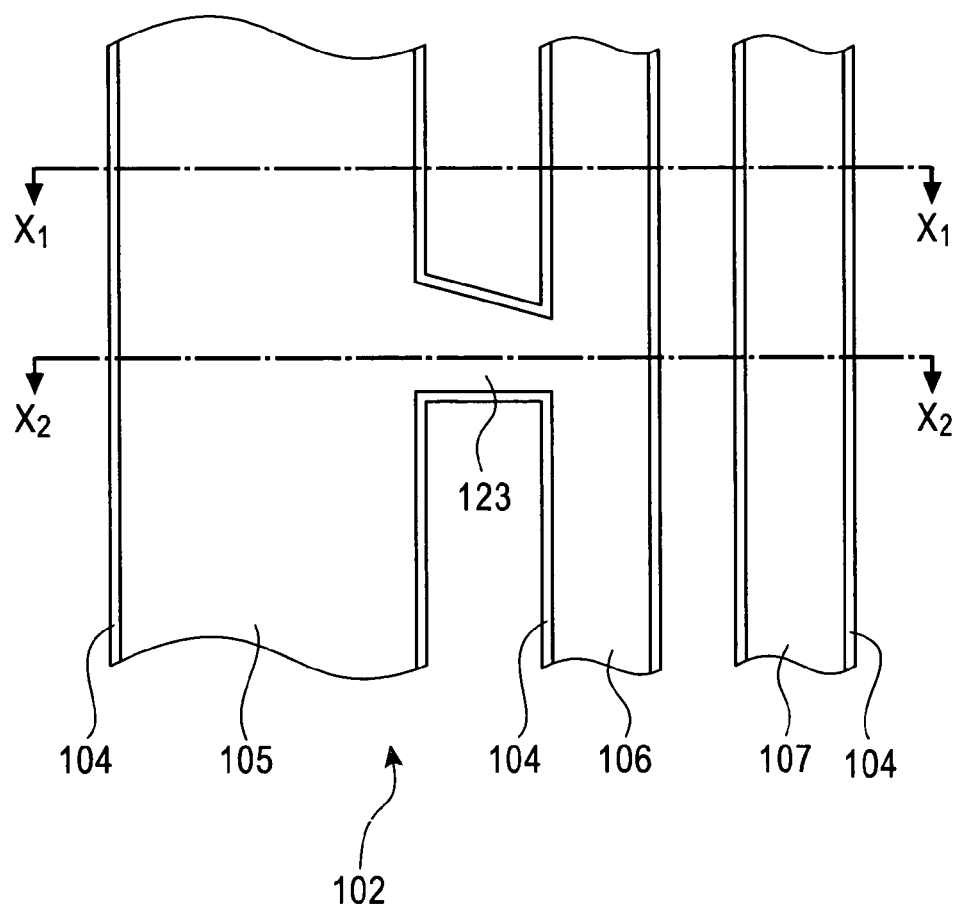
FIG. 2 is an enlarged top view drawing of the semiconductor chip outside edge region showing this seal ring.
Figure 3:
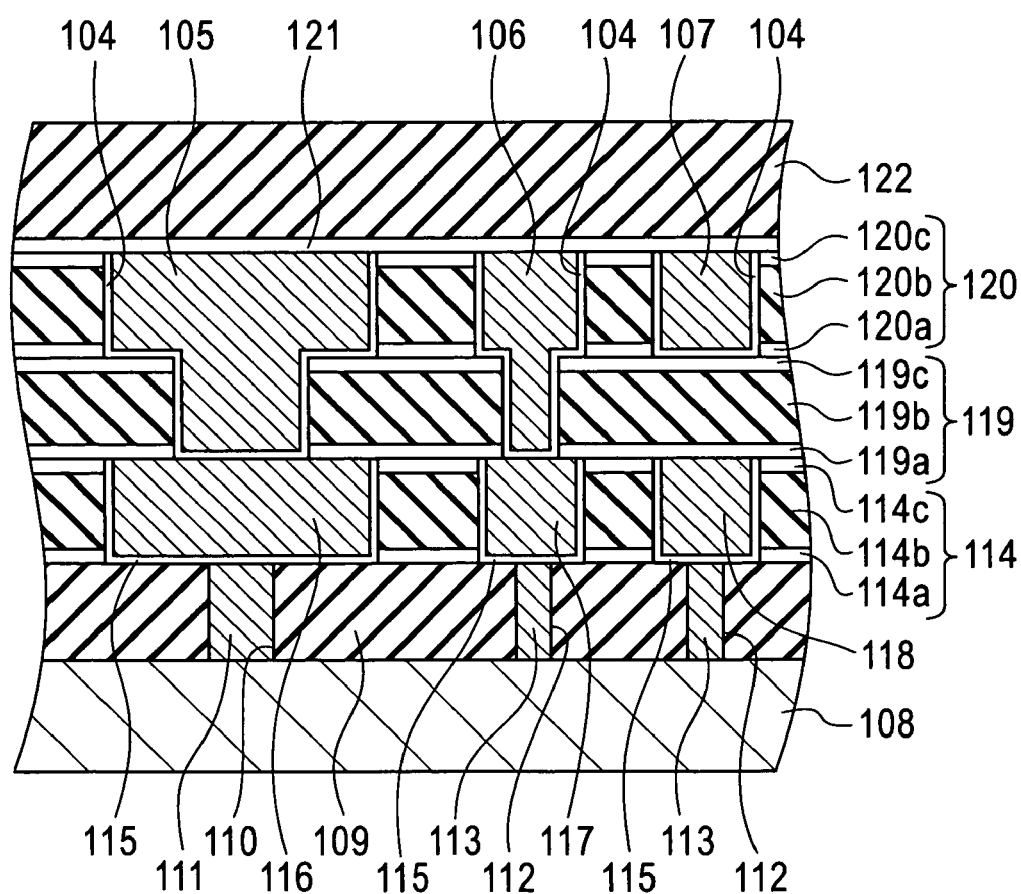
FIG. 3 is a cross-section view of the outside edge of the semiconductor chip showing this seal ring.
Figure 4A:
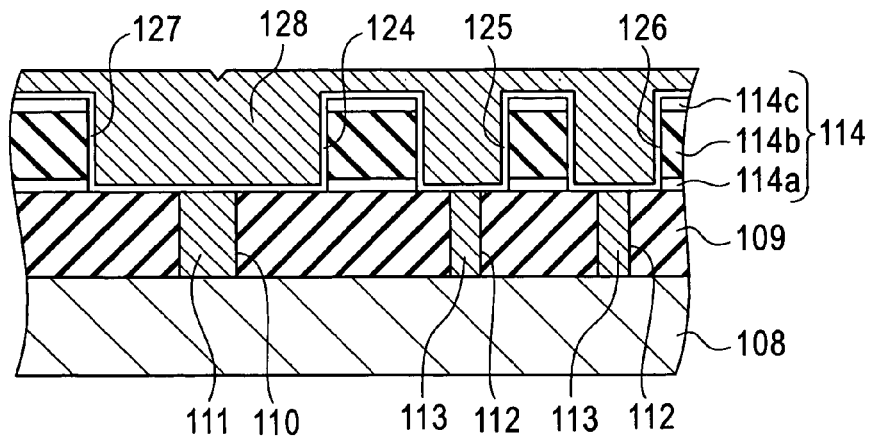
FIG. 4A through FIG. 4C are elemental cross-section views by manufacturing process of this seal ring.
Figure 4B:
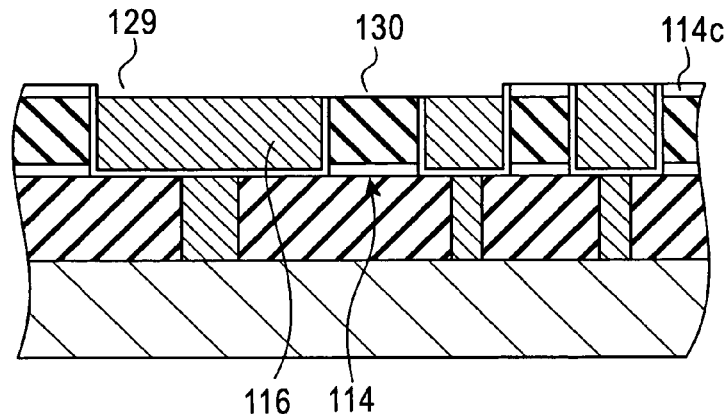
Figure 4C:
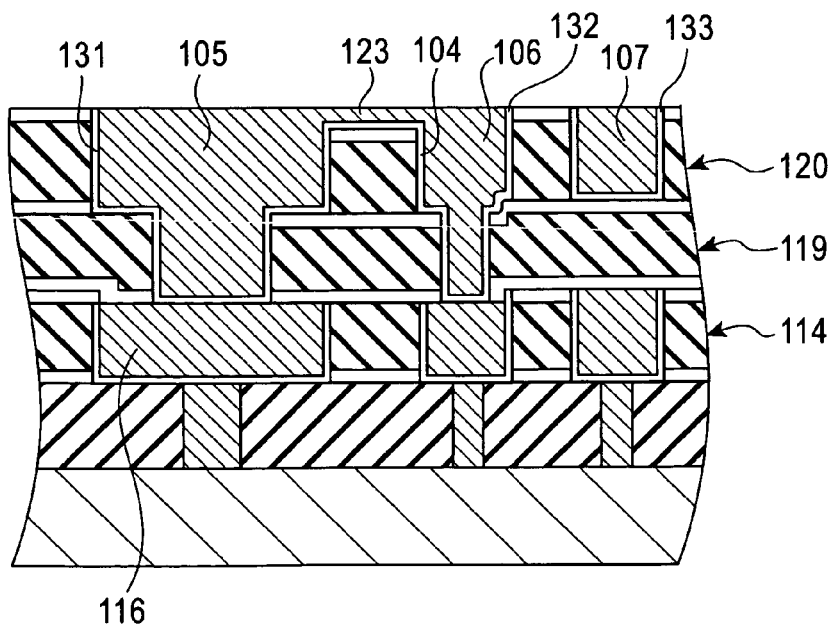
Figure 5:
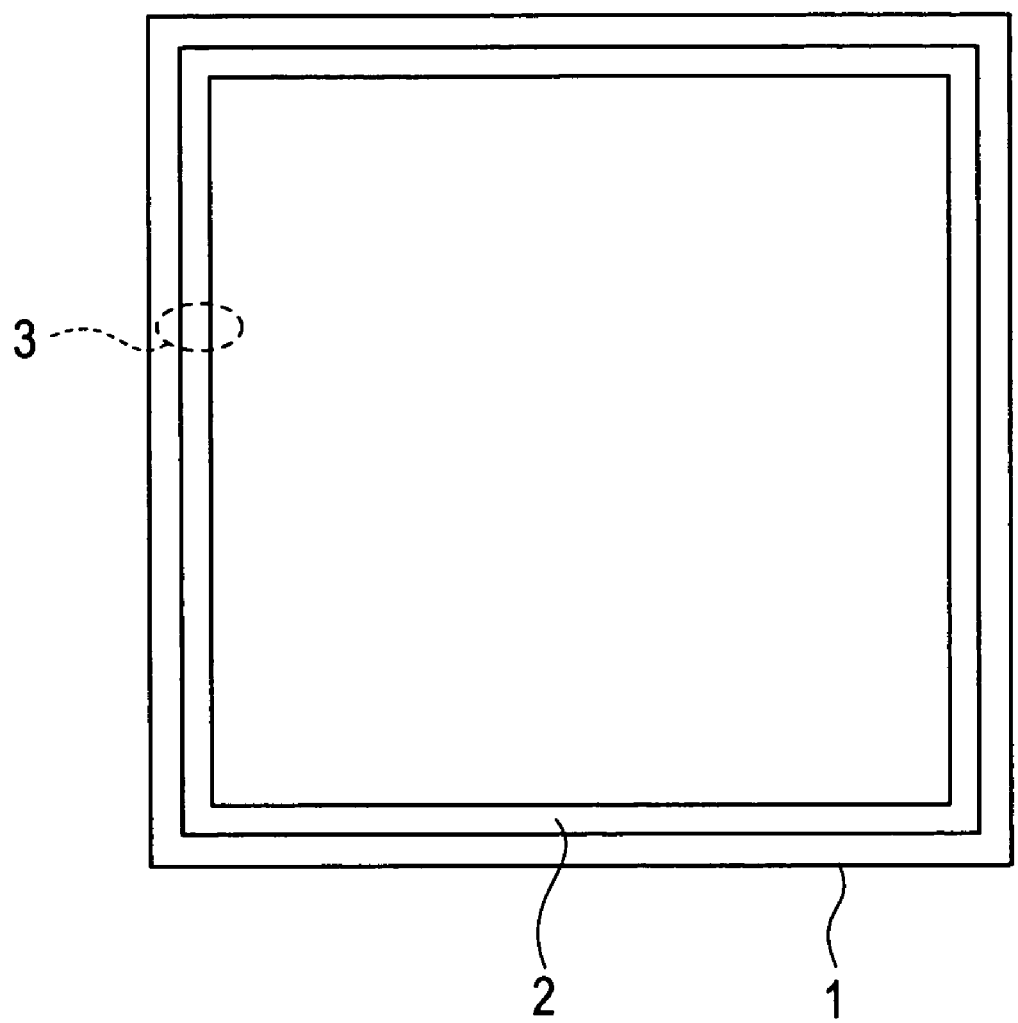
FIG. 5 is a top view drawing of a semiconductor chip showing the seal ring of an embodiment of the present invention.
Figure 6:
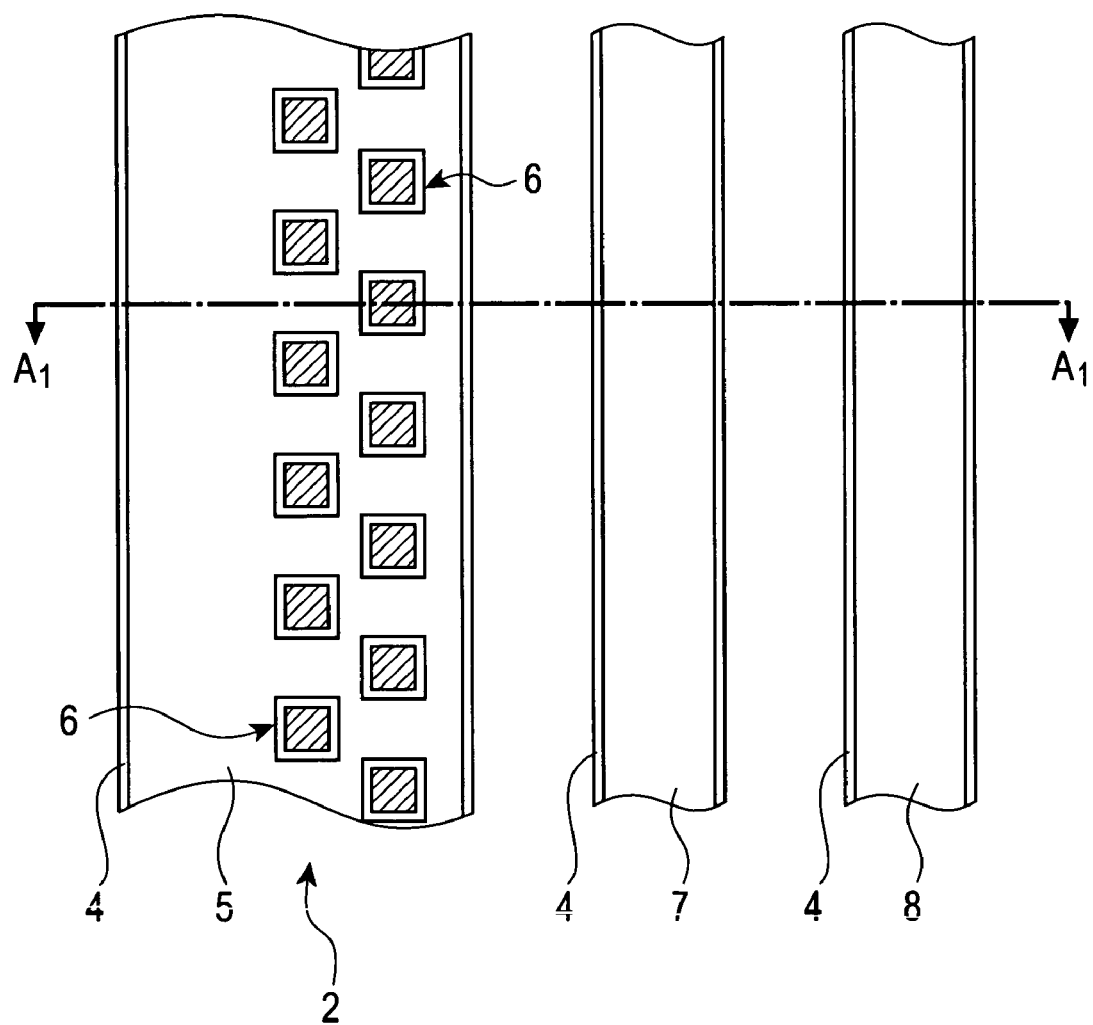
FIG. 6 is an enlarged top view drawing of the semiconductor chip outside edge region showing this seal ring.

A preferred embodiment of the present invention will be described below while referring to the drawings. In this description, objects which are common to all drawings are assigned the same reference numerals. FIG. 5 is a top view drawing of a semiconductor chip which has a two-dimensional arrangement on a semiconductor wafer, FIG. 6 is a partial enlarged drawing of the surrounding edge of a semiconductor chip, FIG. 7 is a cross-section view of the seal ring region of the present invention, and FIG. 8A through FIG. 8C are element cross-section views by manufacturing process for the seal ring region of the present invention.

As shown in FIG. 5, a seal ring 2 is formed along the outside edge of a semiconductor chip 1 so as to enclose an element forming region. A partial enlargement of this region 3 is shown in FIG. 6. The seal ring 2 of this embodiment is formed by connecting multiple overlaying layers of the same material which makes up the wiring and via plug of the semiconductor device similar to as described for the conventional technology. FIG. 6 shows the top layer of wiring which is comprising damascene wiring.

Similar to as described for the conventional technology, an upper layer barrier layer 4 comprising a conductive barrier material film is formed on the groove side wall of the interlayer insulating film of the semiconductor device, and an upper layer seal ring wiring 5, with for instance a 10 micrometer width, comprising a wiring material film (hereinafter referred to as conductor material) is embedded in a groove. Furthermore, a plurality of isolated pockets of insulating material 6 are formed dispersed in the upper layer seal ring wiring 5. These isolated pockets of insulating material 6 have a rectangular top surface configuration, and the dimensions are preferably 0.5 micrometers or greater. As will be described later, these isolated pockets of insulating material 6 are made from the aforementioned interlayer insulating film. Furthermore, a first upper layer groove wiring 7 and a second upper layer groove wiring 8 and the like are positioned in the element forming region, and the upper layer barrier layer 4 is formed around the perimeter. The upper layer seal ring wiring line 5 and both upper layer wiring lines are all (dual) damascene wiring structures.

Figure 7:
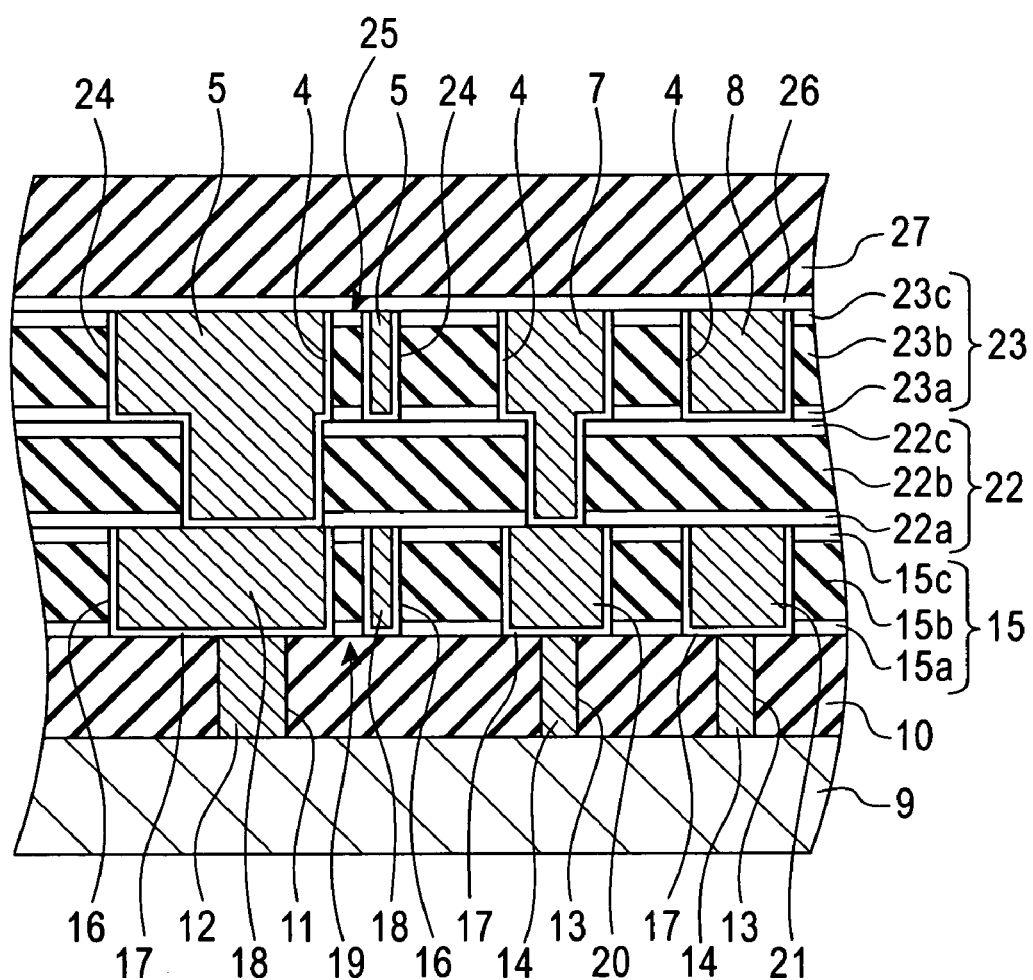
FIG. 7 is a cross-section view of the outside edge of the semiconductor chip showing this seal ring.
Figure 8A:
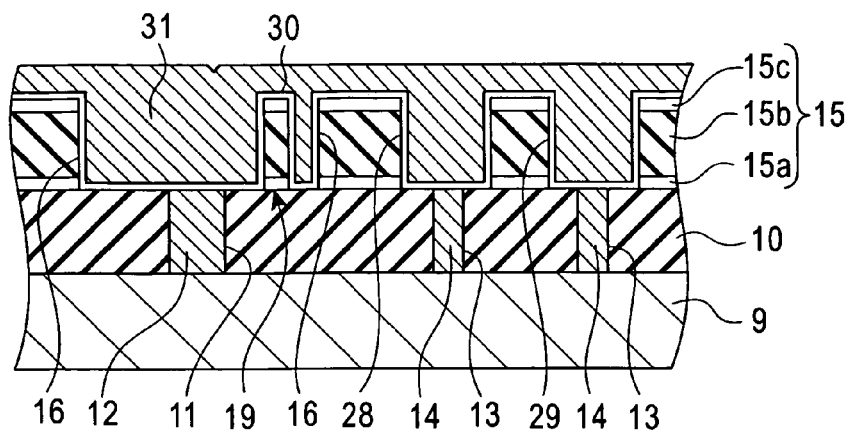
FIG. 8A through FIG. 8C are elemental cross-section views by manufacturing process of this seal ring.
Figure 8B:
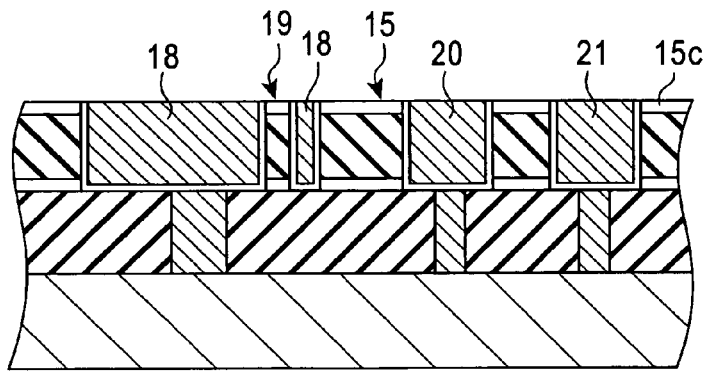
Figure 8C:
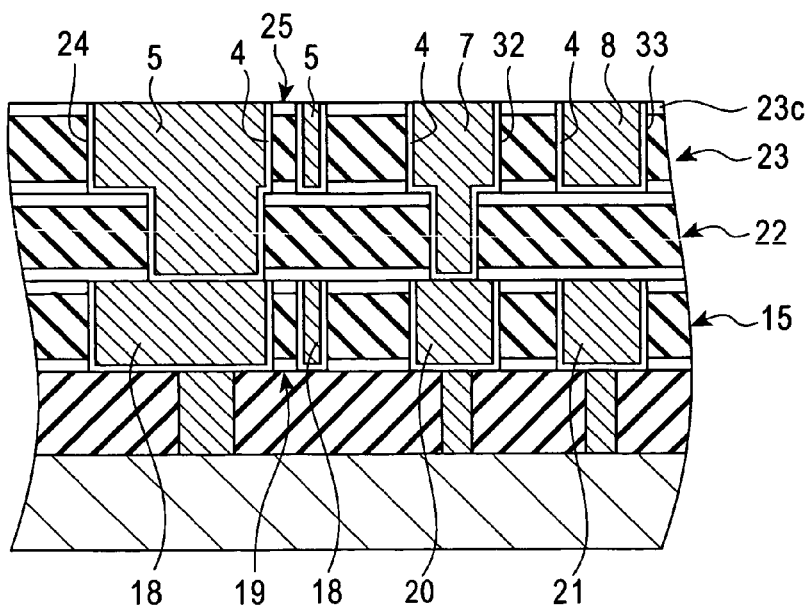

The cross-section structure of the seal ring of this embodiment is as shown in FIG. 7. FIG. 7 is a cross-section drawing viewed in the direction of arrow $A_1$-$A_1$ in FIG. 6. As shown in FIG. 7, a bottom insulating film 10 made from a silicon oxide film is formed on a silicon substrate 9, and a contact hole for seal ring 11 which extends to the surface of the silicon substrate 9 is formed in a designated region of the bottom insulating film 10 on the outside edge region of the semiconductor chip. This contact hole fox seal ring 11 is formed around the outside edge of the semiconductor chip 1 as shown in FIG. 5. This contact hole for the seal ring 11 is filled by a seal ring contact plug 12 made from a conductor such as tungsten. Similarly, a contact hole 13 is formed to extend to the gate electrode (not shown in the drawings) and a dispersion layer which is formed on the surface of the silicon substrate 9 in the element forming region, and this contact hole 13 is filled with a contact plug 14 made from a conductor such as tungsten.

Furthermore, similar to as described for the conventional technology, in order to form the lower layer damascene wiring line of the semiconductor device, a first interlayer insulating film 15 comprising multiple layers of a first etching stopper layer 15a, a first low inductance film 15b, and a first cap layer 15c is formed, a lower layer barrier layer 17 and a lower layer seal ring wiring line 18 is formed in a lower layer seal ring groove 16 in a designated region and connected to the seal ring contact plug 12. Furthermore, isolated pockets of lower layer insulating material 19 which have for instance a cuboid structure are positioned in the lower layer seal ring groove 16. The isolated pockets of lower layer insulating material 19 are made from the insulating materials which form the first interlayer insulating film 15. The lower layer seal ring wiring line 18 is the damascene wiring structure.

Similarly, lower layer barrier layer 17, first lower layer groove wiring line 20, and second lower layer groove wiring line 21 are formed in the wiring groove in the designated region of the first interlayer insulating film 15, and are connected to the corresponding contact plugs 14. The line width of both lower layer groove wiring lines is approximately 0.1 micrometers. Furthermore, the first low inductance film 15b is a p-MSQ film with a relative inductance of approximately 2.0, and the first etching stopper layer 15a and the first cap layer 15c are insulating films such as SiC film or SiOC film.

Next, a second interlayer insulating film 22, comprising multiple layers of a second etching stopper layer 22a, a second low inductance film 22b, and a second cap layer 22c, is formed and then a third interlayer insulating film 23, comprising multiple layers of a third etching stopper layer 23a, a third low inductance film 23b, and a third cap layer 23c, is formed. Furthermore, an upper layer seal ring groove 24 with a dual damascene structure is formed in the second interlayer insulating film 22 and the third interlayer insulating film 23, and the upper layer seal ring wiring 5 which will be a dual damascene wiring structure is connected to the lower layer seal ring wiring 18 and is established together with the upper layer barrier layer 4. Furthermore, isolated pockets of upper layer insulating material 25 which have for instance a cuboid structure are formed and dispersed in the upper layer seal ring groove 24. The isolated pockets of upper layer insulating material 25 are made from the insulating material which makes up the third interlayer insulating film 23, and are arranged in a pattern which overlays the isolated pockets of lower layer insulating material 19.

Furthermore, a first upper layer groove wiring line 7 with a dual damascene wiring structure is formed to be electrically connected to the first lower layer wiring line 20 in the second interlayer insulating film 22 and the third interlayer insulating film 23, and a second upper layer groove wiring line 8 with a damascene wiring structure is formed together with an upper layer barrier layer 4 in the third interlayer insulating film 23. The second low inductance film 22b and the third low inductance film 23b are p-MSQ films with a relative inductance ratio of approximately 2.0. The second etching stopper layer 22a, the third etching stopper layer 23a, the second cap layer 22c, and the third cap layer 23c are insulating films such as SiC film or SiOC film.

Furthermore, a passivation layer 27 comprising an SiON film and a fourth etching stopper layer 26 made from an SiC film or an SiOC film is formed to cover the whole surface.

Next, the manufacturing method for the seal ring of the present embodiment will be described while referring to FIG. 8A through FIG. 8C FIG. 8A through FIG. 8C are element cross-section views by production process viewed in the direction of arrow $A_1$-$A_1$ of FIG. 6. In FIG. 8A through FIG. 8C, components similar to those in FIG. 7 are assigned the same code.

As shown in FIG. 8A, similar to as described for the conventional technology, a silicon oxide film is overlaid on a silicon substrate 9 of a semiconductor wafer by a commonly known CVD method, the surface is flattened using a CMP method, and the bottom insulating film 10 is formed. The aforementioned contact hole for seal ring 11 and contact hole 13 are formed as described above in designated regions using publicly known photolithography technology and dry etching technology, and these contact holes are filled with titanium, titanium nitride, or tungsten or the like to form a seal ring contact plug 12 and a contact plug 14.

Next, a first interlayer insulating film 15 comprising a first etching stopper layer 15a, a first low inductance film 15b, and a first cap layer 15c formed using a CVD method or a spin coating method. Furthermore, the first cap layer 15c, first low inductance layer 15b, and the first etching stopper layer 15a are successively etched using publicly known photolithography technology and dry etching technology. Next, lower layer seal ring groove 16 with a line width of approximately 10 micrometers, isolated pockets of lower layer insulators 19 with a surface dimension between approximately 0.5 micrometers and 1 micrometer for instance, and a first lower layer wire ring groove 28 and a second lower layer wire ring groove 29 with a line width of approximately 0.1 micrometers are then formed. Furthermore, a barrier material film 30 such as tantalum nitride is overlaid across the whole surface using a PVD method, and then a wiring material layer 31 such as a copper film is formed using a plating method or the like.

Next, as shown in FIG. 8B, CMP of the wiring material film 31 and the barrier material film 30 is successively performed in order to remove the unneeded regions of the wiring material film 31 and the barrier material film 30 from above the first cap layer 15c. Next, the lower layer seal ring wiring line 18, the first lower layer groove wiring line 20, and the second lower layer groove wiring line 21 are formed. in this CMP process, as described above, the width of the seal ring groove 16 is relatively large at approximately 10 micrometers, but dishing which occurred with the conventional technology will not occur above the lower layer seal ring wiring line 18 because of the presence of the isolated pockets of lower layer insulators 19. Furthermore, erosion will not occur in the surface of the first interlayer insulating film 15 in the region of the lower layer seal ring wiring line 18 during the CMP process.

Next, as shown in FIG. 8C, the surface is made uniform, a second interlayer insulating film 22 comprising a second etching stopper layer 22a, a second low inductance film 22b, and a second cap layer 22c is formed over the lower layer seal ring wiring line 18, isolated pockets of lower layer insulators 19, first interlayer insulating film 15, first lower layer groove wiring line 20, and second lower layer groove wiring line 21, and then a third interlayer insulating film 23 comprising multiple layers of the third etching stopper layer 23a, the third low inductance film 23b, and the third cap layer 23c is formed over the second interlayer insulating film 22. Next, the upper layer seal ring groove 24, the first upper layer wiring groove 32, and the second upper layer wiring groove 33 are formed in the second interlayer insulating film 22 and the third interlayer insulating film 23 using publicly known photolithography technology and dry etching technology.

Furthermore, a barrier material film such as tantalum nitride is overlaid over the whole surface using a PVD method, and then a wiring material film such as a copper film is formed using a plating method or the like, and the wiring material film and the barrier material film in the unneeded regions above the third cap layer 23c are removed by CMP. In this manner, the upper layer seal ring wiring line 5, the first upper layer groove wiring line 7, and the second upper layer groove wiring line 8 will be formed together with the upper layer barrier layer 4. The upper layer seal ring wiring line 5 is connected to the lower layer seal ring wiring line 18, and the first upper layer groove wiring line 7 is electrically connected to the first lower layer groove wiring line 20.

Next, a fourth etching stopper layer 26 and a passivation film 27 are formed using a CVD method to complete a semiconductor device with a seal ring which has a damascene wiring structure as shown in FIG. 7.

Figure 9:
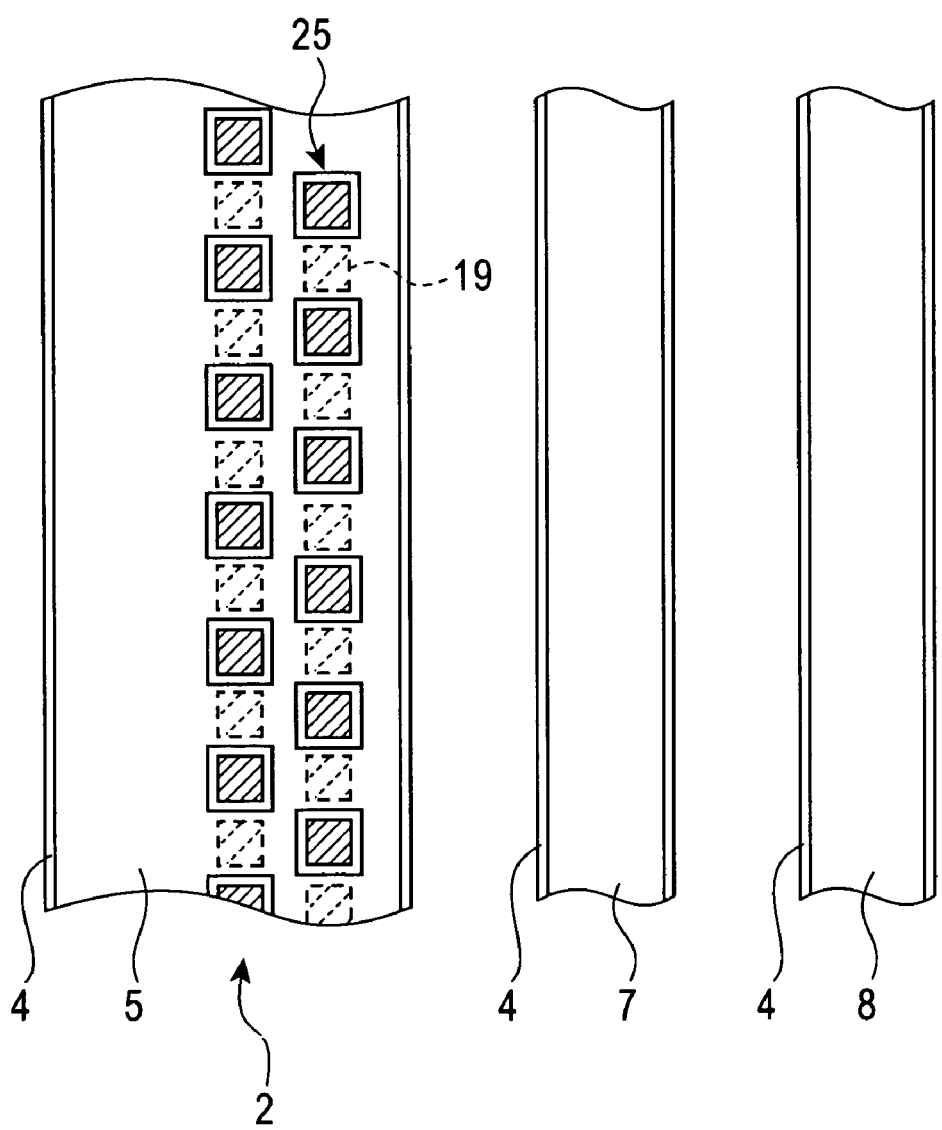
FIG. 9 is an enlarged top view drawing of the outside edge region of the semiconductor chip showing another example of a seal ring which is an embodiment of the present invention.

Continuing, another variation of the embodiment of the present invention will be described while referring to FIG. 9. In this embodiment, the pattern position of the isolated pockets of lower layer insulators 19 and isolated pockets of upper layer insulators 25 in the seal ring 2 are shifted. All other regions have the same structure as described in FIG. 6. An upper layer barrier layer 4 made from the barrier material film is formed on the groove side wall of the interlayer insulating film of the semiconductor device, and the upper seal ring wiring line 5 with a width of 10 micrometers for instance and made from wiring material film is embedded in the groove. Next, a plurality of isolated pockets of upper layer insulators 25 are formed dispersed in the upper layer seal ring wiring line 5 so as to not overlap the pattern layout of the isolated pockets of lower layer insulators 19 which are formed in the lower layer seal ring wiring line 18 as described in FIG. 7. In this case as well, the top surface configuration of the isolated pockets of insulators 6 is rectangular, with a dimension of 0.5 micrometers or larger, and preferably 1.0 micrometers.

Using the aforementioned preferred embodiment, electrical shorting is prevented from occurring between a seal ring which has a damascene wiring structure and a groove wiring line or an electrode pad which are adjacent to the seal ring in a semiconductor device which has a damascene wiring structure, and therefore the yield of the semiconductor device can be increased. Furthermore, using this preferred embodiment, bridge regions which cause the aforementioned dishing will not occur even if the seal ring width is wide, and therefore the seal ring width can be increased. Furthermore, as described above, moisture can be prevented from penetrating into the low inductance film caused by cracks in the interlayer insulating film. Furthermore, forming multiple layers of damascene wiring lines in a semiconductor device is simplified. In addition, reducing the inductance of the interlayer insulating film of a damascene wiring structure is simplified, allowing for faster speeds for the semiconductor device.

Preferred embodiments of the present invention have been described above, but these embodiments do not restrict the present invention. It is possible for a person with ordinary skill in the art to add various modifications and changes to a specific embodiment without deviating from the technical concept and technical scope of the present invention.

For instance, the surface configuration of the isolated pockets of insulators may have other configurations besides being rectangular. FIG. 7 and FIG. 9 show cases where the surface configuration was square, but cases where the configuration is circular, elliptical, or enclosed by an arbitrary closed curved line can also be applied to the present invention. Furthermore, cases where the seal ring has an overlapping structure consisting of a damascene wiring structure and a non-damascene wiring structure can also be applied to the present invention. Furthermore, cases formed with multiple layer structures of two or more seal rings can also be applied to the present invention.

Furthermore, multiple layers of an insulating film which has high polishing resistance during the CMP process such as a thin silicon nitride film may also be used on the interlayer insulating film in the region where the seal ring is formed as a substitute for the interlayer insulating film which forms the damascene wiring line as described above for the isolated pockets of insulators of the present invention.

Furthermore, with the seal ring of the present invention, when multiple layers of conductive material which form the wiring and the via plugs such as the lower layer seal ring wiring and the upper layer seal ring wiring are overlaid and connected, these connecting regions do not necessarily need to be electrically connected, and it is also acceptable for a insulating film such as a silicon oxynitride film or a silicon nitride film which have low moisture absorbency or low moisture permeability to be placed between.

Furthermore, other insulating films which have a siloxane backbone or insulating films which have an organic polymer as a main backbone or insulating films of these materials which have been made porous may be used similar to the p-MSQ film as the low inductance film of the present invention. Note, insulating films which have the aforementioned siloxane backbone include silica films which have at least one bond selected from Si—$CH_3$ bonds, Si—H bonds, and Si—F bonds, which are silsesquioxane type insulating films, and insulating films which have an organic polymer main backbone include SiLK (registered trade name) made from an organic polymer. Furthermore, commonly known insulating materials which may be used as the silsesquioxane type insulating film include hydrogen silsesquioxane (HSQ) and methylated hydrogen silsesquioxane (MHSQ) or the like in addition to the aforementioned MSQ.

Furthermore, SiCN film, SiN film (silicon nitride film), $SiO_2$ film, SiOF film, and SiON film may also be used as the aforementioned etching stopper layer or the cap layer. Furthermore, Ta film, W film, WN film, WSiN film, Ti film, TiN film, or TiSiN film may be used as the barrier material film which becomes the aforementioned barrier layer.

This application is based on Japanese Patent Application No. 2004-177259 which is hereby incorporated by reference.

What is claimed is:

1. A semiconductor device which has semiconductor elements, a wiring layer, and a plurality of interlayer insulating film layers on a semiconductor substrate, wherein
   a seal ring which encloses a semiconductor element region is formed with a damascene wiring structure using conductor material which forms the wiring layer, said seal ring having a first side and a second side, said first side being nearer than said second side to the semiconductor element region, and
   an isolated pocket group having a plurality of first and second isolated pockets of insulating material arranged in designated regions of the seal ring, said plurality of first isolated pockets constituting a first row of said isolated pocket group near said first side of said seal ring and said plurality of second isolated pockets constituting a second row of said isolated pocket group near said second side of said seal ring,
   wherein said plurality of first and second isolated pockets are arranged in a zigzag pattern along said first and second sides of said seal ring adjacent the semiconductor element region, and a shortest distance between said first side of said seal ring and said first row of said isolated pocket group is smaller than a shortest distance between said second side of said seal ring and said second row of said isolated pocket group.

2. The semiconductor device as claimed in claim 1, wherein the seal ring is formed in a multilayer structure comprising an upper layer damascene wiring structure and a lower layer damascene wiring structure which are connected together, and the first and second isolated pockets of insulating material formed in designated regions in the upper layer damascene wiring structure are arranged to not be aligned over isolated pockets of insulating material formed in the lower layer damascene wiring structure.

3. A semiconductor chip comprising:

a semiconductor wafer;

a plurality of semiconductor elements within a semiconductor element region of the semiconductor wafer;

a plurality of interlayer insulating film layers overlying the semiconductor wafer and the semiconductor element region;

wiring layers within the plurality of interlayer insulating film layers and connected to the semiconductor elements;

a seal ring that encloses the semiconductor element region, said seal ring having a first side and a second side, said first side being nearer than said second side to the semiconductor element region, the seal ring is a damascene wiring structure within a continuous groove in the plurality of interlayer insulating film layers along an entire periphery of the semiconductor wafer; and a plurality of first and second isolated pockets of insulating material within the seal ring that extend through the continuous groove, wherein said plurality of first isolated pockets constitute a first row near said first side of said seal ring and said plurality of second isolated pockets constitute a second row near said second side of said seal ring, said plurality of first and second isolated pockets are arranged in a zigzag pattern, and a shortest distance between said first side of said seal ring and said first row of said first isolated pockets is smaller than a shortest distance between said second side of said seal ring and said second row of said second isolated pockets.

* * * * *